(12) United States Patent
Liu

(10) Patent No.: US 6,319,820 B1
(45) Date of Patent: Nov. 20, 2001

(54) FABRICATION METHOD FOR DUAL DAMASCENE STRUCTURE

(75) Inventor: Haochieh Liu, Taipei (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/561,578

(22) Filed: Apr. 28, 2000

(30) Foreign Application Priority Data

Mar. 21, 2000 (TW) .................................................. 89105154

(51) Int. Cl.[7] .................................................. H01L 21/4763
(52) U.S. Cl. .......................... 438/633; 438/622; 438/624; 438/761
(58) Field of Search .................................... 438/633, 622, 438/624, 761

(56) References Cited

U.S. PATENT DOCUMENTS

| 6,071,806 | * | 6/2000 | Wu et al. | 438/622 |
| 6,083,822 | * | 7/2000 | Lee | 438/624 |
| 6,114,233 | * | 9/2000 | Yeh | 438/622 |
| 6,124,216 | * | 9/2000 | Ko et al. | 438/766 |
| 6,127,089 | * | 10/2000 | Subramanian et al. | 430/270 |
| 6,140,706 | * | 10/2000 | Wang et al. | 257/775 |
| 6,153,514 | * | 11/2000 | Wang et al. | 438/640 |
| 6,159,840 | * | 12/2000 | Wang | 438/618 |
| 6,169,039 | * | 1/2001 | Lin et al. | 438/761 |
| 6,180,514 | * | 1/2001 | Yeh et al. | 438/633 |
| 6,187,663 | * | 2/2001 | Yu et al. | 438/624 |

* cited by examiner

Primary Examiner—John F. Niebling
Assistant Examiner—Olivia Luk
(74) Attorney, Agent, or Firm—Jiawei Huang; J. C. Patents

(57) ABSTRACT

A fabrication method for a dual damascene structure is described wherein a substrate covered by a HSQ layer is provided. An E-beam curing is conducted on the HSQ layer where the via hole is to be formed. Photolithography and etching are further conducted on the HSQ layer to form a trench. Since the E-beam cured HSQ layer and the thermally cured HSQ layer have a high etching selectively ratio, the HSQ layer that has not been E-beam cured can be wet etched to from a via hole. A dual damascene structure is formed after filling the trench and the via hole with a conductive material, wherein either the via hole or the trench can be first formed.

13 Claims, 5 Drawing Sheets

FABRICATION METHOD FOR DUAL DAMASCENE STRUCTURE

CROSS-REFERENCE TO RELATED APPLICATION

This application claims the priority benefit of Taiwan application Ser. No. 89105154, filed Mar. 21, 2000.

BACKGROUND OF THE INVENTION

1. Field of the Invention

The present invention relates to a fabrication method for a semiconductor device. More particularly, the present invention relates to a fabrication method for a dual damascene structure in a dielectric material.

2. Description of the Related Art

As the levels of an integrated circuit continue to increase, the demands on the metallization process for the wiring technique of a semiconductor wafer increase correspondingly. In the conventional metallization process, a patterned photoresist layer is formed for each metal layer in the etching of the individual metal layer in order to form the metal conductive line. The metal layer is also required to connect to the device region of a semiconductor substrate for the wafer fabrication. A vertical interconnect is formed by forming a hole in the insulation layer used to separate the metal layers. Forming holes in different insulation layers would require performing a photolithography process on each insulation layer. As the number of layers that requires metallization increases, the number of photolithography processes increases correspondingly. The manufacturing of a semiconductor wafer thereby becomes more complicated. Currently in the ultra large scale integration (ULSI), to concurrently form a horizontal trench and a vertical hole using a single photoresist process in metallization and to employ the similar technique to form a multi-level interconnect on a highly integrated wafer have thereby posed a great challenge in the semiconductor industry.

When the technology has evolved from the very large scale integration (VLSI) to the ultra large scale integration (ULSI), it is necessary to improve electron migration for the increase of the speed of a device and the computer operation. It is therefore essential for the semiconductor industry to develop new methods and technologies for the manufacturing of a highly integrated semiconductor wafer. In a highly integrated wafer, the actual distance between devices is reduced to provide not only a faster transmission of an electrical signal, the resistance generated in signal transmission is also reduced. On the other hand, the ultra large scale integration is formed with very small devices and the multi-level interconnects. The operation of the multi-level interconnects hence must have a minimum increase of resistance in signal transmission, and most importantly, impedance matching must be avoided.

A semiconductor wafer usually comprises one or multiple conductive lines formed thereon. These conductive lines are isolated from each other with an insulation layer. An insulation layer is also used to isolate the devices near the semiconductor surface. These conductive lines are interconnected to each other and are connected to the devices at the appropriate regions. The metal conductive lines are connected to each other by filling a hole formed in the insulation layer with a metal layer. Conventionally, there are many approaches to form the metal line and the multi-level interconnects. The hole that passes through the insulation layer to allow the interconnection between the metal conductive lines is known as the via hole. The hole that passes through the insulation layer to allow the connection with the underlying devices is known as the contact hole. These holes are normally formed by depositing an insulation layer on the semiconductor substrate, followed by etching the insulation layer. Thereafter, a metal layer is deposited to cover the insulation layer and to fill the holes. The metal layer is then etched to form the metal conductive lines. The first metal layer is electrically connected with the underlying device through a contact hole. Similarly, the second metal layer is electrically connected with the underlying metal layers through the via hole. Furthermore, these holes are filled with metal to form the metal plugs, followed by planarizing the metal layer to the surface of the insulation layer. Another metal layer is further deposited as contacts of the metal plugs, followed by etching the deposited metal layer to complete the formation of the individual conductive layer.

In order for the metal interconnect or the metal plugs to have a solid contact region, the spaces reserved for the metal interconnects and the holes must increase to cover the overlay error generated in printed circuit board manufacturing or to cover the processing variations. This type of design rule, however, would increase the dimension of the circuit and significantly reduces the density of the device. The self-aligned process is thereby developed as the wafer becomes miniaturized.

Furthermore, forming contacts between the metal layers in the substrate also encompasses other problems. While the insulation layer is etched to form the contact hole, the sidewall of the contact hole needs to recline a certain degree to ensure an excellent continuity of the metal layer. It is, however, highly probable that the deposited metal layer is discontinuous if the sidewall of the contact hole is reclined too steep. Although a gradually reclining sidewall would ensure the continuity of the metal conductive line, the density of the contacts would be reduced. In addition, such an approach to form the contacts would lead to an irregular and unplanarized surface. As a result, difficulties in manufacturing the subsequent interconnect layer increase.

FIG. 1 is a schematic, cross-sectional view showing the manufacturing of a semiconductor device according to the prior art. As shown in FIG. 1, a substrate 10 comprising a device region 11 is provided. A first insulation layer 12 is formed, wherein a contact window 14 is defined in the insulation layer 12. A first metal layer 13 is deposited on the first insulation layer 12, wherein the first metal layer 13 is connected to the device region 11 through the contact window 14. Similarly, a second metal layer 16 is connected to the first metal layer 13 through via hole 17 defined in the second insulation layer 15. A third insulation layer 18 is further formed to serve as a passivation layer. The structure having the irregular surface as illustrated in FIG. 1 would lead to the problem of an unreliable device. For example, when the insulation layer between the different metal layers becomes thinner, a short circuit may occur in the S region between the first metal layer and the second metal layer, whereas when the metal layers become thinner, an open circuit may occur in the O region.

A conventional approach to solve the aforementioned problem is by dual damascene processing. The dual damascene process is performed on an insulation layer, wherein the insulation layer is formed on a substrate. After the insulation layer is planarized, the insulation layer is defined to form a horizontally oriented trench and a vertically oriented hole concurrently. Through the hole in the first insulation layer, the metal conductive line is connected with the underlying device region. Through hole in an upper insulation layer, the metal conductive line is connected with another metal layer. A metal layer is further deposited on the substrate where the above structure is already formed to fill the trench and the hole, forming the metal conductive line and the metal plug. Chemical mechanical polishing (CMP) is further conducted to planarize the surface and to complete the dual damascening of the horizontal trench and the vertical hole.

FIGS. 2A to 2B are cross-sectional views showing the manufacturing of a dual damascene structure according to the prior art. As shown in FIG. 2A, a silicon dioxide layer 22 is deposited on a substrate 21, comprising a conductive region 20 (the conductive region can be a metal or a metal silicide material). Photolithography and etching are conducted to form a via hole 23, which is connected to the conductive region 20. As shown in FIG. 2B, a reverse-tone mask is used to pattern the metal layer and to further form the trenches 24, 25 of the metal interconnect. After the etching is completed, a metal layer is deposited to fill the via hole 23 and the trenches 24, 25. Chemical mechanical polishing is further conducted to remove the excess metal and to form the structure as illustrated in FIG. 2B.

Employing the conventional dual damascene process, the trench and the via hole structure are formed in the same oxide layer. A disadvantage of such process is that the trench and the via hole structure are etched by means of reactive ion etching, which would easily roughen the bottom of the opening. Furthermore, the via hole is etched to expose the conductive region, and the reactive ions may induce damages to the substrate and the conductive material.

SUMMARY OF THE INVENTION

Based on the foregoing, a fabrication method for a dual damascene structure is provided, wherein the conventional wet etching or dry etching are employed to form the via hole and the trench of the dual damascene structure.

The present invention provides a fabrication method for a dual damascene structure, wherein a hydrogen silsesquioxane (HSQ) layer is formed on a semiconductor substrate comprising other device structures. The surface planarization of the HSQ layer is automatically achieved due to the flow property of HSQ. After curing the HSQ layer, a hard mask layer is formed to cover the HSQ layer. Using a reverse-tone mask to define the hard mask layer, the part of the hard mask layer on the region where the via hole is to be formed is preserved. An E-beam curing is then conducted on the HSQ layer. The pail of the HSQ layer not covered by the hard mask layer is striken by the electrons and is transformed into a denser and a more rigid structure. The hard mask layer is subsequently removed. Since the thermally cured HSQ layer and the E-beam cured HSQ layer comprise a high etching selectivity ratio, the thermally cured HSQ layer, which is the part of the HSQ layer covered by the hard mask, has a higher etching rate in the wet etching process. In other words, the thermally cured HSQ layer is being etched at a faster rate to form a via hole to expose a part of the substrate. A photoresist layer is then formed to cover the substrate, wherein a trench pattern is defined in the photoresist layer. Anisotropic etching is then conducted on the exposed HSQ layer to form a trench in the HSQ layer above the via hole, followed by the removal of the photoresist layer.

According to the above method, the via hole is first formed, followed by the formation of the trench. The fabrication method provided by the present invention also allows the formation of the trench first, followed by the etching of the via hole. A major difference in the latter approach is the formation of a photoresist layer on the HSQ layer after the HSQ layer is being E-beam cured and the removal of the hard mask layer. A trench pattern is further defined on the photoresist layer and anisotropic etching is conducted to remove a portion of the HSQ layer to form a trench. The photoresist layer is then removed, followed by wet etching the part of the HSQ layer that has not been E-beam cured to form a via hole in the trench.

The present invention takes advantage of the high etching selectivity ratio between the E-beam cured HSQ layer and the thermally cured HSQ layer to remove the HSQ layer that has not been E-beam cured by means of wet etching to form a via hole that exposes the substrate. Since reactive ion etching is not used to form the via hole, the potential danger of damaging the exposed substrate by the reactive ions during the formation of the via hole is therefore avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the present invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

FIGS. 3A to 3F are schematic, cross-sectional views showing the manufacturing of a dual damascene structure, wherein a via hole first formed followed by the formation of a trench according, to one preferred embodiment of the present invention.

Figure 1:
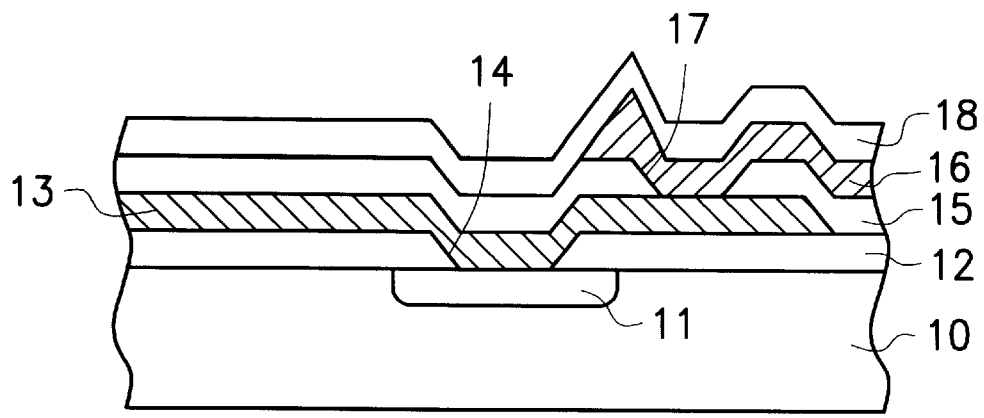
FIG. 1 is a schematic, cross-sectional view showing the manufacturing of a semiconductor device according to the prior art.
Figure 2A:
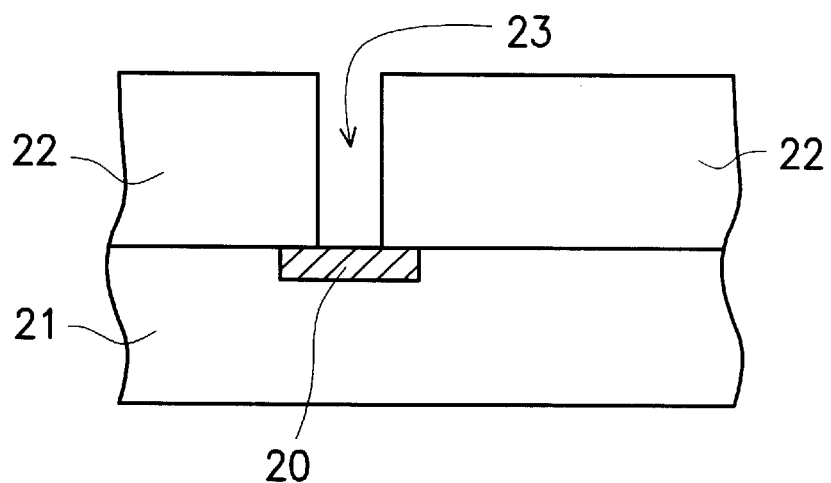
FIGS. 2A and 2B are schematic, cross-sectional views showing the manufacturing of a dual damascene structure according to the prior art.
Figure 2B:
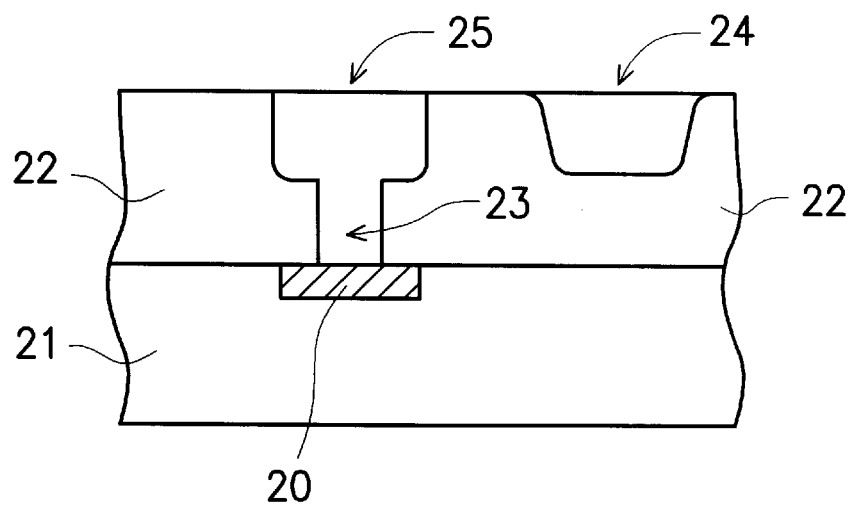
Figure 3A:
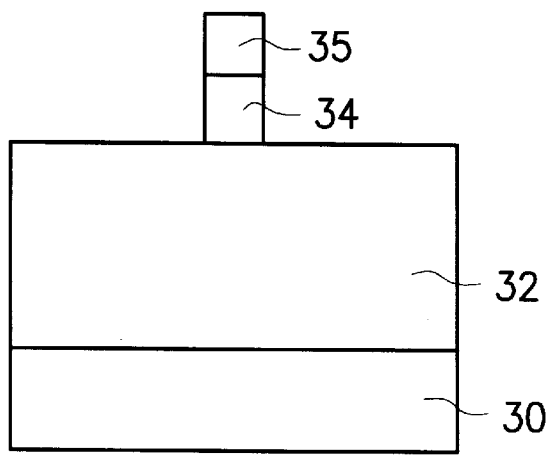
FIGS. 3A to 3F are schematic, cross-sectional views showing the manufacturing of a dual damascene structure, wherein a via hole first formed followed by the formation of a trench according to one preferred embodiment of the present invention.

As shown in FIG. 3A, a HSQ layer 32 is spin-coated to cover a semiconductor substrate 30 which already comprises other device structures. The HSQ layer 32 is about 600 nm to 1800 nm thick. Surface planarization of the HSQ layer 32 is automatically achieved due to the flow property of HSQ. A thermal treatment is further conducted on the spin-coated HSQ layer 32 to cure the HSQ layer 32 by driving out the excess moisture and solvent. The thermal curing is conducted at a temperature of 300 to 500 degrees Celsius. After the HSQ layer is cured, a hard mask layer 34 is formed to cover the HSQ layer 32 and a photoresist layer 35 is formed on the hard mask layer 34. The photoresist layer 35 is further defined using a reverse-tone via mask. The hard mask layer 34 is then etched, leaving only the hard mask layer 34 on the region where the via for the metal interconnect is to be formed. The hard mask layer 34 includes polysilicon, oxide, silicon nitride, silicon oxy-nitride, titanium nitride, aluminum oxide silicon carbide, and has a thickness of about 10 nm to 1000 nm.

Figure 3B:
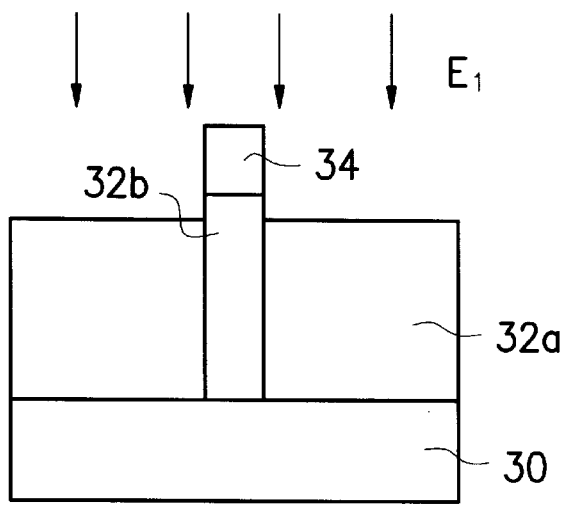

Continuing to FIG. 3B, the photoresist layer 35 is removed. An E-beam curing process $E_1$ is conducted on the HSQ layer 32 and the remaining hard mask layer 34. The part of the HSQ layer 32a not covered by the hard mask layer 34 is striken by the E-beam and is transformed into a denser and a more rigid structure, whereas the part of the HSQ layer 32b covered by the hard mask layer 34 maintains its original condition. The parameters for the E-beam curing process is conducted at a substrate temperature of about 300 to 500 degrees Celsius, an electron dosage of about 1000 to 10000 microC./cm$^2$ and an energy of about 1 to 20 KeV.

Figure 3C:
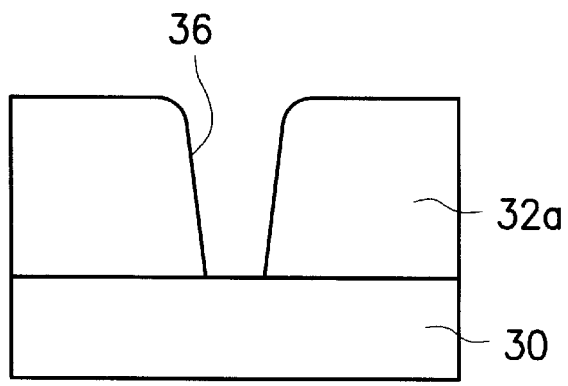

Continuing to FIG. 3C, chemical mechanical polishing or plasma reactive ion etching (RIE) is conducted to remove the hard mask layer 34. Wet etching is then conducted on the HSQ layer 32a and 32b. The E-beam cured HSQ layer 32a and the thermally cured HSQ layer 32b have different etching rates, and the etching selectivity ratio of the E-beam cured HSQ layer 32a to the thermally cured HSQ layer 32b is about 1/20. In another words, during the wet etching process, the thermally cured HSQ layer 32b, the part that is covered by the hard mask layer 34, has a higher etching rate. Thus, the thermally cured HSQ layer 32b is being removed faster, forming a via hole 36 to expose a portion of the substrate 30. The E-beam curing further provides a better control on the subsequent wet etching process when forming the via hole 36 and an improved tapered via hole 36 profile.

Figure 3D:
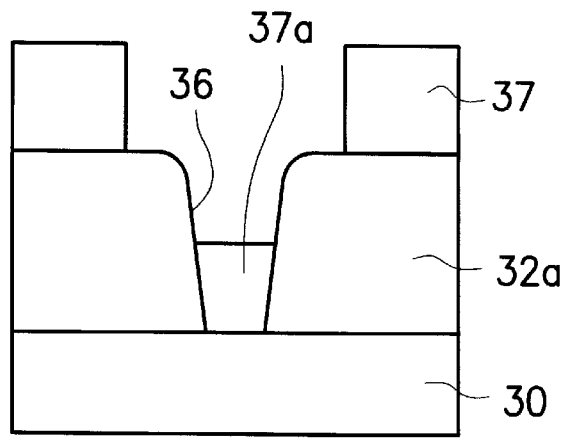

Referring to FIG. 3D, a photoresist layer 37 is then formed to cover the HSQ layer 32a, wherein a trench pattern is defined in the photoresist layer 37. The photoresist layer 37a also fills the via hole 36.

Figure 3E:
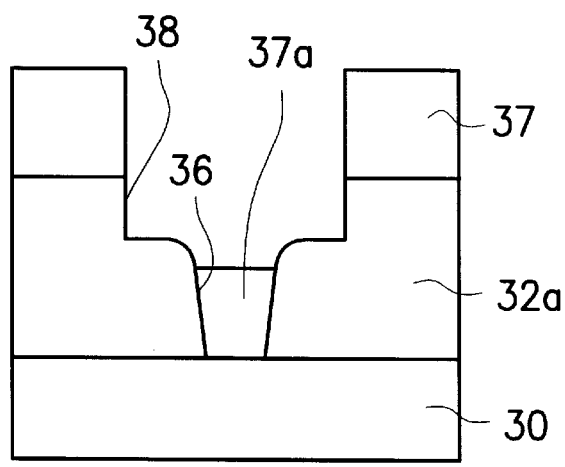

As shown in FIG. 3E, anisotropic etching is conducted on the exposed HSQ layer 32a to remove the HSQ layer on the upper part of the via hole 36 to form a trench 38. The photoresist layer 37 on the HSQ layer 32a and the photoresist layer 37a are subsequently removed.

Figure 3F:
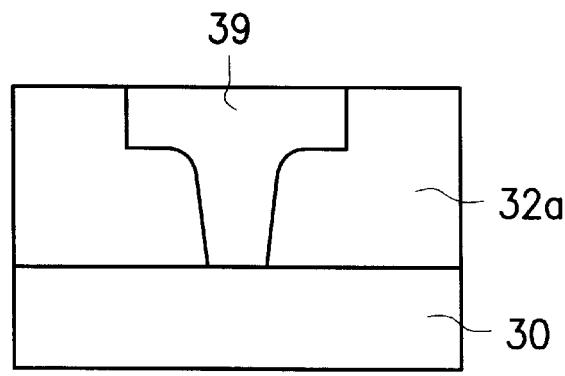

Referring to FIG. 3F, after removing the photoresist layer 37 and the photoresist layer 37a, the trench and the via hole are filled with a conductive material, for example, tungsten, copper, aluminum/copper alloy or polysilicon, to form a dual damascene structure.

The aforementioned manufacturing process for a dual damascene structure is to form the via hole first, followed by forming the trench. The present invention further provides a manufacturing process for a dual damascene structure wherein the trench is formed first followed by forming the via hole, and the cross-sectional views of a dual damascene structure formed according to the second process is illustrated in FIGS. 4A to 4F.

Figure 4A:
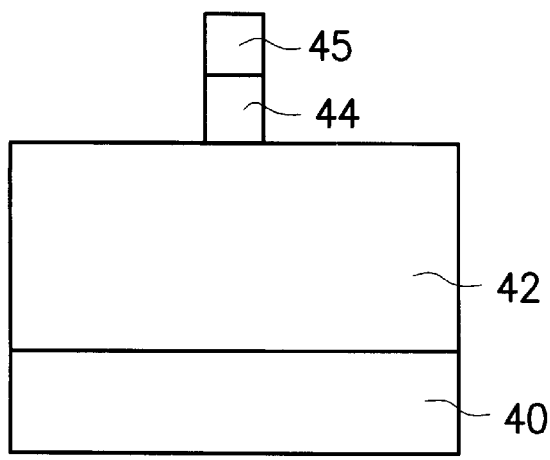
FIGS. 4A to 4F are schematic, cross-sectional views showing the manufacturing of a dual damascene structure, wherein a trench is first formed followed by the formation of a via hole according to another preferred embodiment of the present invention.

As shown in FIG. 4A, a HSQ layer 42 is spin-coated on a semiconductor substrate 40, which already comprises other device structures. The thickness of the HSQ layer 42 is about 600 to 1800 nm thick. Due to the inherent flow property of HSQ, surface planarization of the HSQ layer 42 is automatically achieved. A thermal curing is then conducted on the HSQ layer 42 to remove the excess moisture and solvent. The thermal curing is conducted at a temperature of about 300 to 500 degrees Celsius. After the HSQ layer is cured, a hard mask layer 44 is formed to cover the HSQ layer 42 and a photoresist layer 45 is formed to cover the hard mask layer 44. A reverse-tone via mask is used to define the photoresist layer 45, followed by etching the mask layer 44 so that the remaining mask layer 44 covers the area where the via for the metal interconnect is going to be formed. The hard mask layer 44 includes polysilicon, oxide, silicon nitride, silicon oxy-nitride, titanium nitride, aluminum oxide and carbonated silicon, and has a thickness of about 10 to 1000 nm.

Figure 4B:
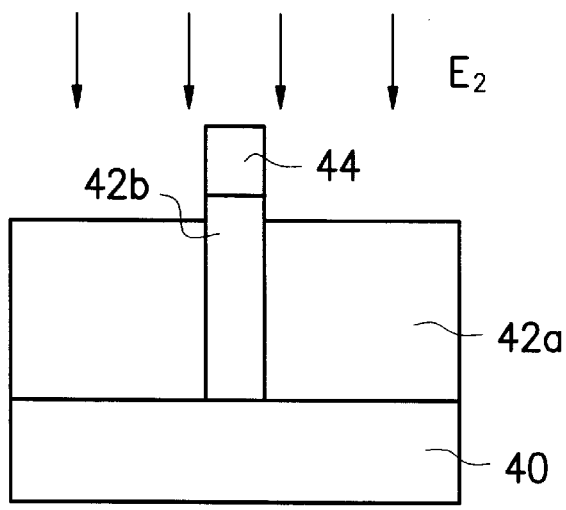

Continuing to FIG. 4B, the photoresist layer 45 is removed. An E-beam curing $E_2$ is then conducted on the HSQ layer 42. The part of the HSQ layer 42a not covered by the hard mask layer 44 is striken by electrons and is transformed into a denser and a more rigid structure. The part of the HSQ layer 42b covered by the hard mask layer 44 is prevented from being striken by the electrons and is maintaining its original condition. The E-beam curing is conducted at a substrate temperature of about 300 to 500 degrees Celsius, an electron dosage of about 1000 to 10000 microC./cm$^2$ and an energy of about 1 to 20 KeV.

Figure 4C:
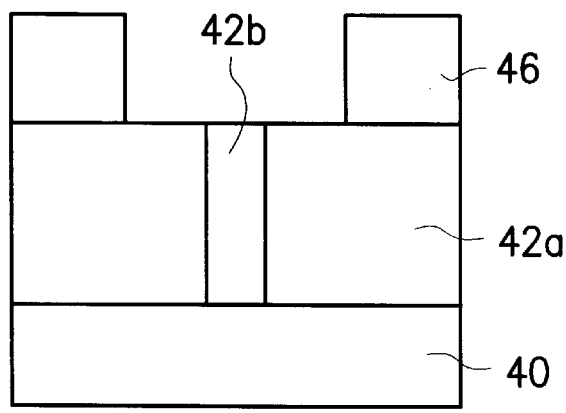
Figure 4D:
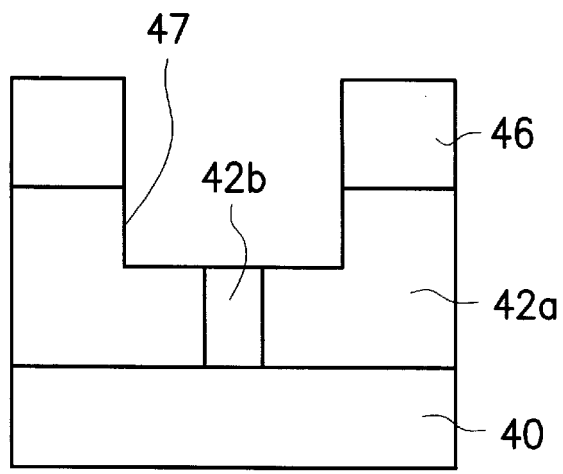

Continuing to FIG. 4C, chemical mechanical polishing or plasma reactive ion etching (RIE) is conducted to remove the hard mask layer 44. A photoresist layer 46 is then formed on the HSQ layer 42a. A trench pattern is defined in the photoresist layer 46, exposing the HSQ layer 42b not being E-beam cured and a part of the E-beam cured HSQ layer 42a.

Continuing to FIG. 4B, the photoresist layer 45 is removed. An E-beam curing $E_2$ is then conducted on the HSQ layer 42. The part of the HSQ layer 42a not covered by the hard mask layer 44 is striken by electrons and is transformed into a denser and a more rigid structure. The part of the HSQ layer 42b covered by the hard mask layer 44 is prevented from being striken by the electrons and maintains its original condition. The E-beam curing is conducted at a substrate temperature of about 300 to 500 degrees Celsius, an electron dosage of about 1000 to 10000 microC./cm$^2$ and an energy of about 1 to 20 KeV.

Figure 4E:
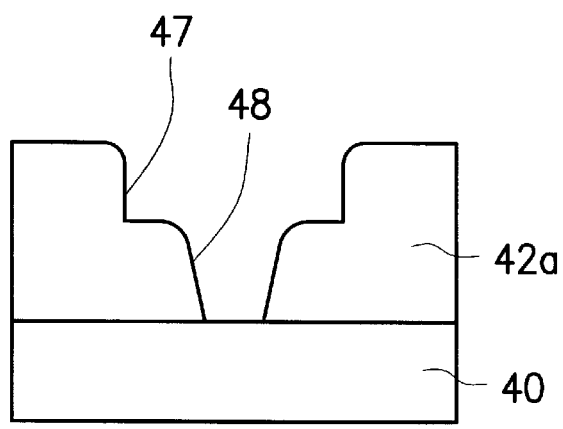
Figure 4F:
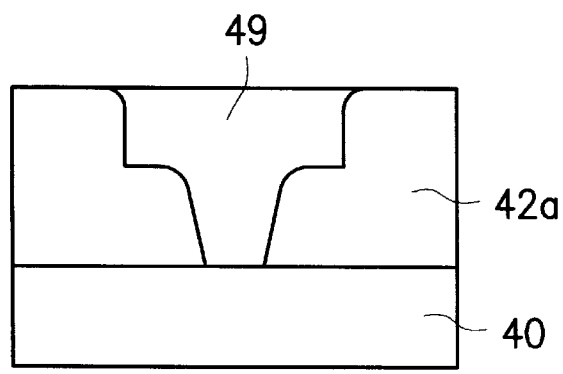

As shown in FIG. 4E, after the removal of the photoresist layer 46, wet etching is conducted to remove the remaining of the HSQ layer 42b that has not been E-beam cured. The etchant used to form the trench 47 and the via hole 48 includes a dilute hydrofluoric acid (HF) and a dilute buffered hydrofluoric acid (BHF). A conductive material 49 further fills the trench 47 and the hole 48 thereby completing the formation of a dual damascene structure as shown in FIG. 4F.

The present invention provides a fabrication method for a dual damascene structure, wherein the method is applicable in forming the via first, or in forming the trench first. A major difference between the two approaches is when the trench is formed first, a photoresist layer is formed on the HSQ layer after the E-beam curing is conducted on the HSQ layer and the removal of the hard mask layer. A trench pattern is then formed on the photoresist layer. Anisotropic etching is then conducted to remove a portion of the HSQ layer to form a trench. The photoresist layer is further removed followed by wet etching the HSQ layer that has not been E-beam cured to form the via hole in the trench.

The present invention takes advantage of the high etching selectivity ratio between the E-beam cured HSQ layer and the thermally cured HSQ layer to remove the thermally cured HSQ layer by wet etching and to form the via hole that exposes the substrate. The formation of a via hole with reactive ion etching is thus prevented. The potential damage induced on the substrate, which is exposed by the via hole, in reactive ion etching is thereby prevented.

Furthermore, since the E-beam cured HSQ layer and the thermally cured HSQ layer have a high etching selectivity ratio, performing wet etching would provide similar effects as anisotropic etching. The dimension and the profile of the via hole are more easily controlled even with wet etching.

In addition, the via hole is formed by wet etching and not by the conventional reactive ion etching. The problem of potential damages on the semiconductor substrate due to the reactive ions, leading to a defective device, is also prevented.

Furthermore, although HSQ is being used as an example for the dielectric layer, a spin-on-glass (SOG) layer can also be used as the dielectric layer to cover the semiconductor substrate. After undergoing an E-beam curing process, the SOG layer would exhibit the same characteristics as the HSQ layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a dual damascene structure comprising:

providing a substrate;

forming a hydrogen silsequioxane layer (HSQ) to cover the substrate;

thermal curing the HSQ layer;

forming a hard mask layer on the thermal cured HSQ layer to cover a portion of the thermal cured HSQ layer;

performing an E-beam curing on a remaining exposed portion of the thermal cured HSQ layer to transform the remaining exposed portion of the thermal cured HSQ layer into an E-beam cured HSQ layer;

removing the hard mask;

performing a wet etching to selectively remove the thermal cured HSQ layer to form a via hole and to expose a part of the substrate;

forming a patterned photoresist layer on the E-beam cured HSQ layer and a photoresist layer partially filling the via to cover the exposed past of the substrate, wherein the patterned photoresist layer exposes a part of the E-beam cured HSQ layer and the via hole;

selectively removing the exposed part of the E-beam cured HSQ layer to form a trench above the via hole;

removing the photoresist layer on the E-beam cured HSQ layer and the photoresist layer in the via hole; and forming a conductive material to fill the trench and the via hole.

2. The fabrication method according to claim 1, wherein the HSQ layer is about 600 nm to about 1800 nm thick.

3. The fabrication method according to claim 1, wherein the hard mask layer is selected from a group consisting of polysilicon, oxide, silicon nitride, silicon oxy-nitride, titanium nitride, aluminum oxide and carbonated silicon.

4. The fabrication method according to claim 1, wherein the mask layer is about 10–1000 nm thick.

5. The fabrication method according to claim 1, wherein parameters for the E-beam curing process includes a substrate temperature of about 300 to about 500 degrees Celsius, a dosage of about 1000 to about 10000 microC./cm$^2$ and an energy of about 1 to about 20 Kev.

6. The fabrication method according to claim 1, wherein the thermal curing process is conducted at a temperature of about 300 to about 500 degrees Celsius.

7. The fabrication method according to claim 1, wherein the HSQ layer is replaced by a spin-on-glass layer.

8. A fabrication method for a dual damascene structure, comprising:

providing a substrate;

forming a HSQ layer to cover the substrate;

thermal curing the HSQ layer;

forming a hard mask layer on the HSQ layer to cover a portion of the thermal cured HSQ layer;

E-beam curing, a remaining exposed portion of the thermal cured HSQ layer to transform the remaining exposed thermal cured HSQ layer into an E-beam cured HSQ layer;

removing the hard mask layer;

forming a patterned photoresist layer on the E-beam cured HSQ layer, wherein the patterned photoresist layer exposes the thermal cured HSQ layer;

removing a portion of the E-beam cured HSQ layer and a portion of the thermal cured HSQ layer using the photoresist layer as a mask to form a trench;

removing the photoresist layer;

wet etching the remaining thermal cured HSQ layer to form a via hole under the trench and exposing a portion of the substrate; and forming a conductive material to- fill the trench and the via hole.

9. The fabrication method according to claim 8, wherein the HSQ layer is about 600 to about 1800 nm thick.

10. The fabrication method according to claim 8, wherein a material for the mask layer is selected from the group consisting of polysilicon, oxide, silicon nitride, silicon oxy-nitride, titanium nitride, aluminum oxide and carbonated silicon.

11. The fabrication method according to claim 8, wherein the hard mask layer is about 10 nm to about 1000 nm thick.

12. The fabrication method according to claim 8, wherein parameters for the E-beam curing process includes a substrate temperature of about 300 degrees Celsius to about 500 degree Celsius, a dosage of about 1000 microC./cm$^2$ to about 10000 microC./cm$^2$, and an energy of about 1 to about 20 Kev.

13. The fabrication method according to claim 8, wherein the thermal curing is conducted at a temperature of about 300 degrees Celsius to about 500 degrees Celsius.

* * * * *